United States Patent
Xiong (10) Patent No.: US 9,684,210 B2
(45) Date of Patent: Jun. 20, 2017

(54) CURVED LIQUID CRYSTAL DISPLAY PANEL AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Yuan Xiong, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 255 days.

(21) Appl. No.: 14/418,015

(22) PCT Filed: Dec. 22, 2014

(86) PCT No.: PCT/CN2014/094483
§ 371 (c)(1),
(2) Date: Jan. 28, 2015

(87) PCT Pub. No.: WO2016/090672
PCT Pub. Date: Jun. 16, 2016

(65) Prior Publication Data
US 2016/0170251 A1    Jun. 16, 2016

(30) Foreign Application Priority Data

Dec. 12, 2014 (CN) .......................... 2014 1 0766179

(51) Int. Cl.
*G02F 1/1339* (2006.01)
*G03F 7/00* (2006.01)

(52) U.S. Cl.
CPC ........ *G02F 1/13394* (2013.01); *G03F 7/0007* (2013.01); *G02F 2001/13396* (2013.01); *G02F 2001/13398* (2013.01)

(58) Field of Classification Search
CPC ............ G03F 7/0007; G02F 1/133512; G02F 1/133514; G02F 1/133516; G02F 1/13394;
(Continued)

(56) References Cited

U.S. PATENT DOCUMENTS

2009/0231522 A1* 9/2009 Kim .................. G02F 1/13394
349/106
2010/0189996 A1  7/2010 Torr et al.
(Continued)

FOREIGN PATENT DOCUMENTS

CN    101398571 A    4/2009
CN    101678651 A    3/2010
(Continued)

OTHER PUBLICATIONS

Computer-generated translation of Korean application KR 10-2014-0028447 (application date Mar. 11, 2014), publication date Sep. 22, 2015.*
(Continued)

*Primary Examiner* — John A McPherson
(74) *Attorney, Agent, or Firm* — Muncy, Geissler, Olds & Lowe, P.C.

(57) ABSTRACT

A curved liquid crystal display panel and a manufacturing method thereof are disclosed. The method includes a step of using a mask having a light-shielding portion to expose a color-filter photoresist layer, wherein the light-shielding portion is arranged in a position corresponding to an edge of the display panel; a step of developing the exposed color-filter photoresist layer, so that a concave portion corresponding to the position of the light-shielding portion is formed on the color-filter photoresist layer; and a step of forming photo spacers at a position corresponding to the concave portion of the color-filter photoresist layer on a substrate of the display panel.

17 Claims, 3 Drawing Sheets

(58) Field of Classification Search
CPC . G02F 2001/13398; G02F 2001/13396; G02F 1/133305
USPC .............................. 430/7; 349/106, 156, 160
See application file for complete search history.

(56) References Cited

U.S. PATENT DOCUMENTS

| | | | |
|---|---|---|---|
| 2015/0261029 A1* | 9/2015 | Park | G02F 1/13394 349/106 |
| 2015/0370116 A1* | 12/2015 | Chae | G02F 1/13394 349/43 |
| 2016/0231607 A1 | 8/2016 | Wu et al. | |

FOREIGN PATENT DOCUMENTS

| | | |
|---|---|---|
| CN | 203299492 U | 11/2013 |
| CN | 103955096 A | 7/2014 |
| CN | 105291048 A | 2/2016 |

OTHER PUBLICATIONS

Computer-generated translation of Korean application KR 10-2014-0077044 (application date Jun. 24, 2014), publication date Sep. 15, 2015.*

* cited by examiner

FIG. 1

PRIOR ART

FIG. 2

PRIOR ART

CURVED LIQUID CRYSTAL DISPLAY PANEL AND MANUFACTURING METHOD THEREOF

BACKGROUND OF THE INVENTION

Field of the Invention

The present invention relates to the field of liquid crystal display technology, and more particularly to a curved liquid crystal display panel and a manufacturing method thereof.

Description of the Related Art

Curved liquid crystal display panels are wildly used because they provide better visual experiences. The current process of manufacturing a curved liquid crystal display device usually is first forming a flat panel structure for a liquid crystal display, then performing a bending treatment on this flat panel structure so as to form the curved liquid crystal display device.

Figure 1:
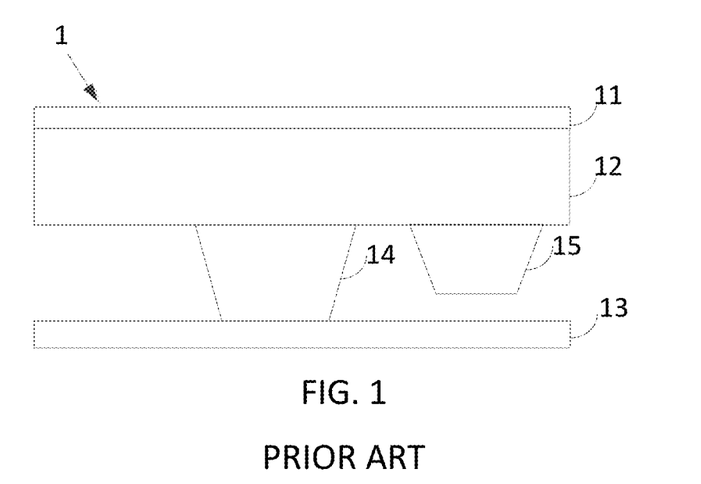
FIG. 1 is a schematic view showing a partial structure of a conventional flat panel structure of a curved liquid crystal display panel before bending treatment.

With reference to FIG. 1, FIG. 1 is a schematic view showing a partial structure of a conventional flat panel structure of a curved liquid crystal display panel before being bended. The conventional curved liquid crystal display panel 1 includes a color-filter substrate, an array substrate 13, a liquid crystal layer and a plurality of photo spacers (PS). The color-filter substrate includes a substrate 11 and a color filter film 12. The liquid crystal layer is mounted between the color-filter substrate and the array substrate. The photo spacers are used to maintain a gap between the color-filter substrate and the array substrate, and include primary spacers 14 and secondary spacers 15. There are usually a sealant mounted at the edge of the liquid crystal display panel so as to fix and support the color-filter substrate and the array substrate.

Figure 2:
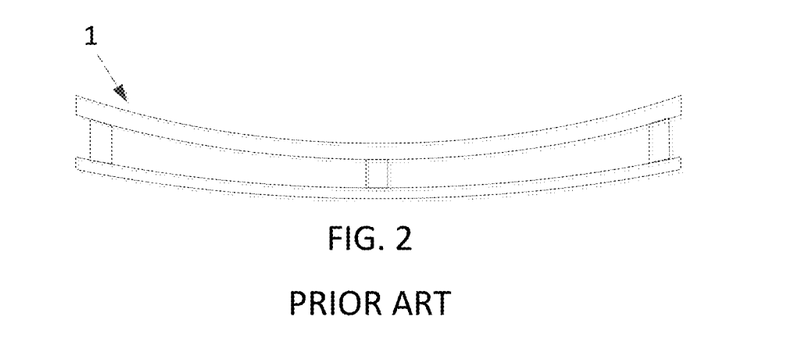
FIG. 2 is a schematic view showing a curved status of the conventional curved liquid crystal display panel after bending treatment.

During the process of the bending treatment, the flat panel structure of the liquid crystal display panel will be deformed, wherein the photo spacers in the area near the edge have less deformation because of the support of the sealant; however, since the area near the center of the panel does not have any sealant to provide support, the photo spacers at the center area will suffer a much larger stress during the bending, such that the photo spacers at the center area have more deformation than the photo spacers at the edge area. Thus, the edge portion of the display panel will be thicker than the center portion thereof, as shown in FIG. 2 which illustrates a schematic view showing the curved status of a conventional curved liquid crystal display panel. Because of the uneven thickness of the curved liquid crystal display panel, the display quality of the curved liquid crystal display panel becomes lower.

Therefore, it is necessary to provide a curved liquid crystal display panel and a manufacturing method thereof to overcome the problems existing in the conventional technology.

SUMMARY OF THE INVENTION

An object of the present invention is to provide a curved liquid crystal display panel and a manufacturing method thereof to overcome the technical problem that conventional display panels have an uneven thickness and enhance the display effect of liquid crystal display devices.

In order to solve the foregoing technical problem, the present invention provides a manufacturing method of a curved liquid crystal display panel which has a first substrate, a second substrate, a liquid crystal layer mounted between the first substrate and the second substrate and a plurality of photo spacers for maintaining a gap between the first substrate and the second substrate, and the manufacturing method includes steps of:

coating a surface of the first substrate with photoresist materials to form a color-filter photoresist layer;

using a mask to partially expose the color-filter photoresist layer, wherein the mask includes at least one light-transmitting portion and at least one light-shielding portion, and the at least one light-shielding portion is formed at a position corresponding to an edge of the curved liquid crystal display panel;

developing the exposed color-filter photoresist layer so that at least one concave portion corresponding to the position of the at least one light-shielding portion is formed on the color-filter photoresist layer; and forming the plurality of photo spacers at predetermined positions of the first substrate, wherein the predetermined positions correspond to the at least one concave portion of the color-filter photoresist layer.

In one embodiment of the manufacturing method, the mask has a plurality of light-shielding portions, the mask further has at least one first region and at least one second region, the number of light-shielding portions within the first region is less than the number of the light-shielding portions within the second region, wherein a distance from the first region to a center line of the curved liquid crystal display panel is less than a distance from the second region to the center line of the curved liquid crystal display panel.

In one embodiment of the manufacturing method, the mask has a plurality of light-shielding portions; the light-shielding portions are arranged at intervals, wherein the intervals between the light-shielding portions and the area size of the light-shielding portions are determined according to a premeasured deformation amount of the photo spacers of the curved liquid crystal display panel.

In one embodiment of the manufacturing method, a gap between two adjacent light-shielding portions ranges from 1 micrometer to 10 micrometers.

In one embodiment of the manufacturing method, all of the light-shielding portions are equal in size.

In one embodiment of the manufacturing method, the color-filter photoresist layer having the concave portion is mounted on the first substrate; and the step of forming the plurality of photo spacers at predetermined positions of the first substrate further includes a step of forming the photo spacers at the concave portion of the color-filter photoresist layer on the first substrate.

In one embodiment of the manufacturing method, the photo spacers are divided into a plurality of primary photo spacers and a plurality of secondary photo spacers, wherein the step of forming the plurality of photo spacers at predetermined positions of the first substrate is to form the primary photo spacers at the predetermined positions of the first substrate.

The present invention further provides another manufacturing method of a curved liquid crystal display panel having a first substrate, a second substrate, a liquid crystal layer mounted between the first substrate and the second substrate and a plurality of photo spacers for maintaining a gap between the first substrate and the second substrate, comprising steps of:

coating a surface of the first substrate with photoresist materials to form a color-filter photoresist layer;

using a mask to partially expose the color-filter photoresist layer, wherein the mask includes at least one light-transmitting portion and at least one light-shielding portion, the at least one light-shielding portion is formed at a position corresponding to an edge of the curved liquid crystal display panel;

developing the exposed color-filter photoresist layer, so that at least one concave portion corresponding to the position of the at least one light-shielding portion is formed on the color-filter photoresist layer; and forming the plurality of photo spacers at predetermined positions of the second substrate, wherein the predetermined positions correspond to the at least one concave portion of the color-filter photoresist layer.

In one embodiment of the manufacturing method, the mask has a plurality of light-shielding portions, the mask further has at least one first region and at least one second region, the number of light-shielding portions within the first region is less than the number of the light-shielding portions within the second region, wherein a distance from the first region to a center line of the curved liquid crystal display panel is less than a distance from the second region to the center line of the curved liquid crystal display panel.

In one embodiment of the manufacturing method, the mask has a plurality of light-shielding portions; the light-shielding portions are arranged at intervals, wherein the intervals between the light-shielding portions and the area size of the light-shielding portions are determined according to a premeasured deformation amount of the photo spacers of the curved liquid crystal display panel.

In one embodiment of the manufacturing method, a gap between two adjacent light-shielding portions ranges from 1 micrometer to 10 micrometers.

In one embodiment of the manufacturing method, all of the light-shielding portions are equal in size.

In one embodiment of the manufacturing method, the color-filter photoresist layer having the concave portion is mounted on the first substrate; and in the step of forming the plurality of photo spacers at predetermined positions on the second substrate, the photo spacers are formed at predetermined positions on the second substrate, and the predetermined positions correspond to the concave portion of the color-filter photoresist layer on the first substrate.

In one embodiment of the manufacturing method, the photo spacers are divided into a plurality of primary photo spacers and a plurality of secondary photo spacers, wherein the step of forming the plurality of photo spacers at predetermined positions on the second substrate is to form the primary photo spacers at the predetermined positions on the second substrate.

The present invention further provides a curved liquid crystal display panel having:

a first substrate;

a second substrate mounted opposite to the first substrate, wherein a color-filter photoresist layer having at least one concave portion is mounted on the first substrate; the concave portion corresponds to an edge of the curved liquid crystal display panel;

a liquid crystal layer mounted between the first substrate and the second substrate;

a plurality of photo spacers for maintaining a gap between the first substrate and the second substrate, wherein the photo spacers are formed at predetermined positions of the first substrate, and the predetermined positions correspond to the at least one concave portion of the color-filter photoresist layer.

In one embodiment of the curved liquid crystal display panel, the color-filter photoresist layer having the concave portion is mounted on the first substrate; and the photo spacers are formed at the concave portion of the color-filter photoresist layer on the first substrate.

In one embodiment of the curved liquid crystal display panel, the photo spacers are divided into a plurality of primary photo spacers and a plurality of secondary photo spacers; and the photo spacers that are formed at the predetermined positions of the first substrate are the primary photo spacers.

The present invention, by performing a step of forming a color-filter photoresist layer having a concave portion and a step of forming photo spacers at positions corresponding to the concave portions, makes the curved liquid crystal display panel to have an even thickness, and therefore enhances the display effect of the display panel.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

Figure 3:
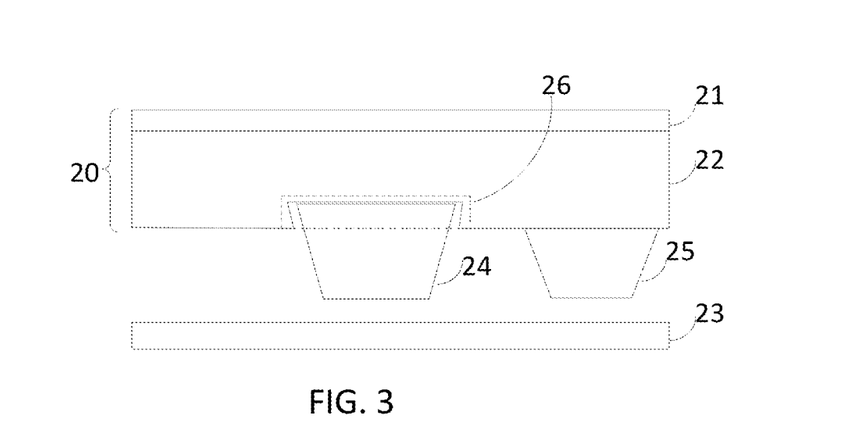
FIG. 3 is a schematic view of a partial structure of a curved liquid crystal display panel according to a first embodiment of the present invention.

With reference to FIG. 3, FIG. 3 is a schematic view of a partial structure of a curved liquid crystal display panel according to a first embodiment of the present invention.

The curved liquid crystal display panel of the present invention comprises a first substrate, a second substrate, a liquid crystal layer, a plurality of photo spacers. The first substrate may be a color-filter substrate 20. The second substrate may be an array substrate 23. The color-filter substrate 20 includes a substrate 21 and a color filter film 22. The liquid crystal layer is mounted between the first substrate and the second substrate. The photo spacers are used for maintaining a gap between the first substrate and the second substrate. The photo spacers are divided into a plurality of primary photo spacers 24 and a plurality of secondary photo spacers 25. A color-filter photoresist layer having at least one concave portion 26 is formed on the color-filter substrate 20. The concave portion 26 of the color-filter photoresist layer corresponds to an edge of the curved liquid crystal display panel. The photo spacers are mounted at the concave portion 26 of the color-filter photoresist layer on the color-filter substrate 20 (FIG. 3 only illustrates that the primary photo spacers which are larger are formed at the concave portion of the color-filter photoresist layer on the color-filter substrate).

In the present embodiment, the manufacturing method of the curved liquid crystal display panel includes the following steps:

Step S101: coating a surface of the color-filter substrate with photoresist materials; wherein the step is to coat a surface of the first substrate or the second substrate with the photoresist materials when one of them is the color-filter substrate; the photoresist materials are negative photoresist materials and may be coated by using a whirl-coating process. After exposure, developing and curing treatments, the negative photoresist materials eventually turn into the foregoing color-filter photoresist layer. The color-filter photoresist layer may include red color-filter units, green color-filter units and blue color-filter units.

Step S102: using a mask to partially expose the color-filter photoresist layer; wherein the mask includes at least one light-transmitting portion and at least one light-shielding portion, and the at least one light-shielding portion is formed at a position corresponding to an edge of the curved liquid crystal display panel; with the exposure, light passes through the light-transmitting portion of the mask and irradiates the color-filter photoresist layer, thereby transferring the pattern formed by the light-shielding portion of the mask onto the color-filter photoresist layer.

Step S103: developing the exposed color-filter photoresist layer; wherein in step S102, since the materials of the color-filter photoresist layer are negative photoresist materials and the light completely irradiates the portions of the color-filter photoresist layer corresponding to the light-transmitting portion, the molecular structure of exposed portions of the color-filter photoresist layer is changed and does not interact with the developer during the developing process of the step S103; in contrast, the light-shielding portion prevents the light from irradiating the color-filter photoresist layer, thus the portion of the color-filter photoresist layer corresponding thereto receives less irradiation of the light and then easily interacts with the developer during the developing process; Finally, after developing, the color-filter photoresist layer has at least one concave portion 26 which is formed at a position corresponding to the light-shielding portion.

Step S104: forming the plurality of photo spacers at the concave portion of the color-filter photoresist layer on the color-filter substrate, wherein when the first substrate or the second substrate is the color-filter substrate, the other one would be the array substrate; since the color-filter photoresist layer is formed on the color-filter substrate, the photo spacers may be formed on the concave portion of the color-filter photoresist layer on the color-filter substrate.

Figure 8:
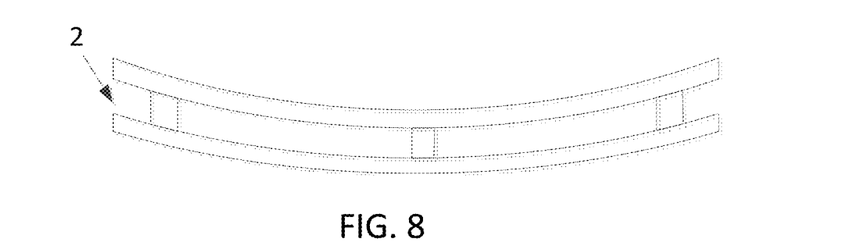
FIG. 8 is a schematic view of a curved liquid crystal display panel provided by performing the manufacturing method of the present invention.

During the process of a bending treatment to make the display panel curved, when the photo spacers near the edge of the liquid crystal display panel are pressed, the photo spacers have a relatively smaller amount of deformation which almost does not change the height thereof; in contrast, when the photo spacers near the center of the liquid crystal display panel are pressed, the photo spacers have a relatively larger amount of deformation which lowers the height thereof. By forming the concave portion at the edge of the color-filter photoresist layer and forming the photo spacers at the concave portion, the difference between the amount of compression exerted on the photo spacers near the edge of the display panel and the amount of compression exerted on the photo spacers near the center of the display panel can be compensated so that the thickness of the edge portion and the center portion of the display panel can be the same. Therefore, the display effect of the curved liquid crystal display panel 2 as shown in FIG. 8, which is manufactured by using the manufacturing method of the present invention, is enhanced.

Figure 4:
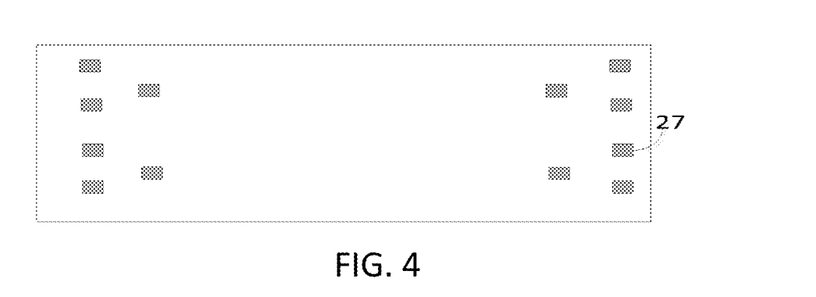
FIG. 4 is a structural schematic view of a mask used in the manufacturing method of the curved liquid crystal display panel according a preferred embodiment of the present invention.

Preferably, as shown in FIG. 4, the mask may include a plurality of light-shielding portions 27 (the grey blocks shown in FIG. 4). The mask may have at least one first region and at least one second region, the number of light-shielding portions within the first region is less than the number of the light-shielding portions within the second region, wherein a distance from the first region to a center line of the curved liquid crystal display panel is less than a distance from the second region to the center line of the curved liquid crystal display panel. That is, the closer the center line of the curved liquid crystal display panel is, the less the light-shielding portions are arranged; the more closer the edge of the curved liquid crystal display panel is, the more the light-shielding portions are arranged. By forming highly concentrated light-shielding portions at the positions corresponding to the edge of the display panel and forming lowly concentrated light-shielding portions at the positions corresponding to the center of the display panel, the amount of the compression on the photo spacers near the edge of the display panel can be compensated as a whole. If the edge portion has less light-shielding portions, a slight height difference may occur. Thus, it would be better to form highly concentrated light-shielding portions at the positions corresponding to the edge of the display panel so that once the concave portions are formed, the overall thickness of the liquid crystal display panel can be more even, thereby enhancing its display effect.

Preferably, the mask includes a plurality of light-shielding portions. The light-shielding portions are arranged at intervals, meaning that there is a gap between the adjacent light-shielding portions. The gap between two adjacent light-shielding portions ranges from 1 micrometer to 10 micrometers so as to ensure that the surface of the concave portion formed after developing is smooth enough to not affect the thickness of the display panel. Taking the amount of bending deformation of the photo spacers of a normal curved liquid crystal display panel (a curved liquid crystal display panel under a normal condition) as a reference value, the depth of the concave portion that can achieve an even thickness may be determined according to the reference value.

The present invention, by performing a step of forming a color-filter photoresist layer having a concave portion and a step of forming photo spacers at positions corresponding to the concave portions, makes the curved liquid crystal display panel to have an even thickness, and therefore enhances the display effect of the display panel.

Figure 5:
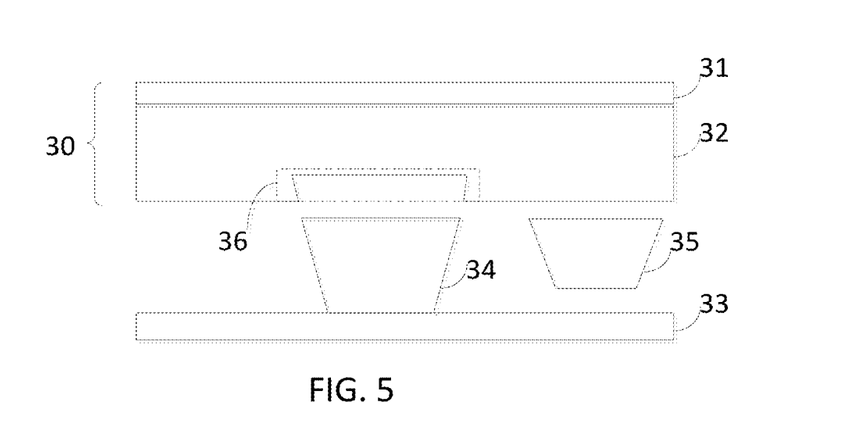
FIG. 5 is a schematic view of a partial structure of a curved liquid crystal display panel according to a second embodiment of the present invention.

With further reference to FIG. 5, FIG. 5 is a schematic view of a partial structure of a curved liquid crystal display panel according to a second embodiment of the present invention.

The curved liquid crystal display panel of the present invention comprises a first substrate, a second substrate, a liquid crystal layer, a plurality of photo spacers. The first substrate may be a color-filter substrate 30. The second substrate may be an array substrate 33. The color-filter substrate 30 includes a substrate 31 and a color filter film 32. The liquid crystal layer is mounted between the first substrate and the second substrate. The photo spacers are used for maintaining a gap between the first substrate and the second substrate. The photo spacers are divided into a plurality of primary photo spacers 34 and a plurality of secondary photo spacers 35. A color-filter photoresist layer having at least one concave portion 36 is formed on the color-filter substrate 30. The concave portion of the color-filter photoresist layer corresponds to an edge of the curved liquid crystal display panel. The photo spacers are mounted on predetermined positions on the array substrate 33, wherein the predetermined positions correspond to the at least one concave portion 36 of the color-filter photoresist layer on the color-filter substrate 30.

The manufacturing method of the curved liquid crystal display panel of the present embodiment is substantially the same as the method described in the first embodiment, however, the difference is that the step of forming the photo spacers is to form the photo spacers at the predetermined positions on the array substrate 33, wherein the predetermined positions correspond to the concave portion 36 of the color-filter photoresist layer on the color-filter substrate 30.

When the first substrate is a color-filter substrate, the photo spacers are formed on the predetermined positions on the second substrate; in contrast, when the second substrate is a color-filter substrate, the photo spacers are formed on the predetermined positions on the first substrate. The predetermined positions correspond to the concave portion 36 of the color-filter photoresist layer on the color-filter substrate 30.

The present invention, by performing a step of forming a color-filter photoresist layer having a concave portion and a step of forming photo spacers at positions corresponding to the concave portions, makes the curved liquid crystal display panel to have an even thickness, and therefore enhances the display effect of the display panel.

Figure 6:
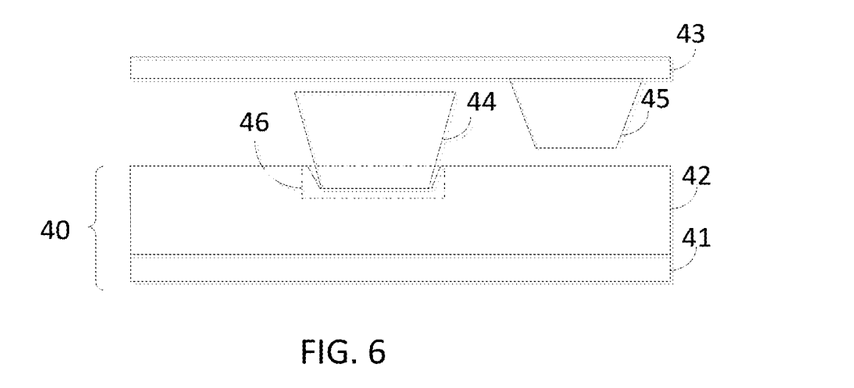
FIG. 6 is a schematic view of a partial structure of a curved liquid crystal display panel according to a third embodiment of the present invention.

With further reference to FIG. 6, FIG. 6 is a schematic view of a partial structure of a curved liquid crystal display panel according to a third embodiment of the present invention.

The curved liquid crystal display panel of the present invention comprises a first substrate, a second substrate, a liquid crystal layer and a plurality of photo spacers. The liquid crystal layer is mounted between the first substrate and the second substrate. The first substrate may be a COA (short for color filter on array) substrate 40. A plurality of thin-film transistors, data lines, scanning lines and pixel electrodes are all formed on the same layer such as an array driving layer 41. The COA substrate is to combine the color filter film 42 with the array driving layer 41 on the same substrate, such as the first substrate. In general, the color filter film 42 is mounted upon the array driving layer 41, wherein the second substrate is provided with a common electrode so that each of the pixel electrodes on the first substrate and the common electrode on the second substrate can cause a voltage difference therebetween to have the corresponding liquid crystal molecules to twist. The second substrate may be the COA substrate while the first substrate is provided with the common electrode. The photo spacers are used for maintaining a gap between the first substrate and the second substrate. The photo spacers includes a plurality of primary photo spacers 44 and secondary photo spacers 45. A color-filter photoresist layer having at least one concave portion 46 is formed on the COA substrate 40. The concave portion of the color-filter photoresist layer corresponds to an edge of the curved liquid crystal display panel. The photo spacers are mounted on the concave portion 46 of the color-filter photoresist layer on the COA substrate 40.

In the present embodiment, the manufacturing method of the curved liquid crystal display panel includes the following steps:

Step S201: coating a surface of the COA substrate with photoresist materials; wherein when the first substrate is the COA substrate, the step is to coat a surface of the color filter film of the first substrate with the photoresist materials; or when the second substrate is the COA substrate, the step is to coat a surface of the color filter film of the second substrate with the photoresist materials; the photoresist materials are negative photoresist materials and may be coated by using a whirl-coating process. After exposure, developing and curing treatments, the negative photoresist materials eventually turn into the foregoing color-filter photoresist layer. The color-filter photoresist layer may include red color-filter units, green color-filter units and blue color-filter units.

Step S202: using a mask to partially expose the color-filter photoresist layer; wherein the mask includes at least one light-transmitting portion and at least one light-shielding portion, and the at least one light-shielding portion is formed at a position corresponding to an edge of the curved liquid crystal display panel; with the exposure, light passes through the light-transmitting portion of the mask and irradiates the color-filter photoresist layer, thereby transferring the pattern formed by the light-shielding portion of the mask onto the color-filter photoresist layer.

Step S203: developing the exposed color-filter photoresist layer; wherein in step S202, since the materials of the color-filter photoresist layer are negative photoresist materials and the light completely irradiates the portions of the color-filter photoresist layer corresponding to the light-transmitting portion, the molecular structure of exposed portions of the color-filter photoresist layer is changed and does not interact with the developer during the developing process of the step S203; in contrast, the light-shielding portion prevents the light from irradiating the color-filter photoresist layer, thus the portion of the color-filter photoresist layer corresponding thereto receives less irradiation of the light and then easily interacts with the developer during the developing process; Finally, after developing, the color-filter photoresist layer has at least one concave portion 46 which is formed at a position corresponding to the light-shielding portion.

Step S204: forming the photo spacers at the concave portion of the color-filter photoresist layer on the COA substrate; wherein when the first substrate is the COA substrate, on the basis of the step S203, the photo spacers are formed on the concave portion of the color-filter photoresist layer on the first substrate; in contrast, when the second substrate is the COA substrate, the photo spacers are formed on the concave portion of the color-filter photoresist layer on the second substrate. During the process of a bending treatment to make the display panel curved, when the photo spacers near the edge of the liquid crystal display panel are pressed, the photo spacers have a relatively smaller amount of deformation which almost does not change the height thereof; in contrast, when the photo spacers near the center of the liquid crystal display panel are pressed, the photo spacers have a relatively larger amount of deformation which lowers the height thereof. By forming the concave portion at the edge of the color-filter photoresist layer and forming the photo spacers at the concave portion, the difference between the amount of compression exerted on the photo spacers near the edge of the display panel and the amount of compression exerted on the photo spacers near the center of the display panel can be compensated so that the thickness of the edge portion and the center portion of the display panel can be the same. Therefore, the display effect of the curved liquid crystal display panel 2 as shown in FIG. 8, which is manufactured by using the manufacturing method of the present invention, is enhanced.

Preferably, as shown in FIG. 4, the mask may include a plurality of light-shielding portions 27 (the grey blocks shown in FIG. 4). The mask may have at least one first region and at least one second region, the number of light-shielding portions within the first region is less than the number of the light-shielding portions within the second region, wherein a distance from the first region to a center line of the curved liquid crystal display panel is less than a distance from the second region to the center line of the curved liquid crystal display panel. That is, the closer the center line of the curved liquid crystal display panel is, the less the light-shielding portions are arranged; the more closer the edge of the curved liquid crystal display panel is, the more the light-shielding portions are arranged. By forming highly concentrated light-shielding portions at the positions corresponding to the edge of the display panel and forming lowly concentrated light-shielding portions at the positions corresponding to the center of the display panel, the amount of the compression on the photo spacers near the edge of the display panel can be compensated as a whole. If the edge portion has less light-shielding portions, a slight height difference may occur. Thus, it would be better to form highly concentrated light-shielding portions at the positions corresponding to the edge of the display panel so that once the concave portions are formed the overall thickness of the liquid crystal display panel can be more even, thereby enhancing its display effect.

Preferably, the mask includes a plurality of light-shielding portions. The light-shielding portions are arranged at intervals, meaning that there is a gap between the adjacent light-shielding portions. The gap between two adjacent light-shielding portions ranges from 1 micrometer to 10 micrometers so as to ensure that the surface of the concave portion formed after developing is smooth enough to not affect the thickness of the display panel. Taking the amount of bending deformation of the photo spacers of a normal curved liquid crystal display panel (a curved liquid crystal display panel under a normal condition) as a reference value, the depth of the concave portion that can achieve an even thickness may be determined according to the reference value.

The present invention, by performing a step of forming a color-filter photoresist layer having a concave portion and a step of forming photo spacers at positions corresponding to the concave portions, makes the curved liquid crystal display panel to have an even thickness, and therefore enhances the display effect of the display panel.

Figure 7:
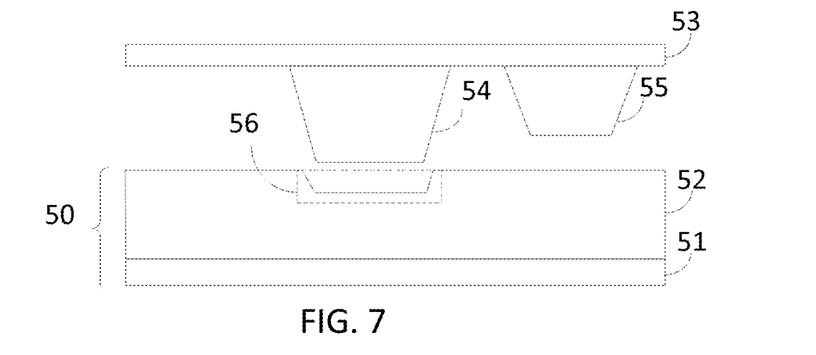
FIG. 7 is a schematic view of a partial structure of a curved liquid crystal display panel according to a fourth embodiment of the present invention.

With further reference to FIG. 7, FIG. 7 is a schematic view of a partial structure of a curved liquid crystal display panel according to a fourth embodiment of the present invention.

The curved liquid crystal display panel of the present invention comprises a first substrate, a second substrate, a liquid crystal layer and a plurality of photo spacers. The liquid crystal layer is mounted between the first substrate and the second substrate. The first substrate may be a COA substrate 50. A plurality of thin-film transistors, data lines, scanning lines and pixel electrodes are all formed on the same layer such as an array driving layer 51. The COA substrate is to combine the color filter film 52 with the array driving layer 51 on the same substrate, such as the first substrate. In general, the color filter film 52 is mounted upon the array driving layer 51. The photo spacers are used for maintaining a gap between the first substrate and the second substrate. The photo spacers includes a plurality of primary photo spacers 54 and secondary photo spacers 55. A color-filter photoresist layer having at least one concave portion 56 is formed on the COA substrate 50. The concave portion 56 of the color-filter photoresist layer corresponds to an edge of the curved liquid crystal display panel. The photo spacers are mounted at predetermined positions on the substrate 53 opposite to the COA substrate 50, wherein the predetermined positions correspond to the concave portion 56 of the color-filter photoresist layer on the COA substrate 50.

The manufacturing method of the curved liquid crystal display panel of the present embodiment is substantially the same as the method described in the third embodiment, however, the difference is that the step of forming the photo spacers is to form the photo spacers at the predetermined positions on the substrate 53 opposite to the COA substrate 50, wherein the predetermined positions correspond to the concave portion 56 of the color-filter photoresist layer on the COA substrate 50.

When the first substrate is the COA substrate, the photo spacers are formed at the predetermined positions on the second substrate; in contrast, when the second substrate is the COA substrate, the photo spacers are formed at the predetermined positions on the first substrate. The predetermined positions are positions corresponding to the concave portion 56 of the color-filter photoresist layer on the COA substrate 50.

The present invention, by performing a step of forming a color-filter photoresist layer having a concave portion and a step of forming photo spacers at positions corresponding to the concave portions, makes the curved liquid crystal display panel to have an even thickness, and therefore enhances the display effect of the display panel.

The present invention has been described with preferred embodiments thereof, and it is understood that many changes and modifications to the described embodiment can be carried out without departing from the scope and the spirit of the invention that is intended to be limited only by the appended claims.

What is claimed is:

1. A manufacturing method of a curved liquid crystal display panel having a first substrate, a second substrate, a liquid crystal layer mounted between the first substrate and the second substrate and a plurality of photo spacers for maintaining a gap between the first substrate and the second substrate, comprising steps of:

coating a surface of the first substrate with photoresist materials to form a color-filter photoresist layer;

using a mask to partially expose the color-filter photoresist layer, wherein the mask includes at least one light-transmitting portion and at least one light-shielding portion, and the at least one light-shielding portion is formed at a position corresponding to an edge of the curved liquid crystal display panel;

developing the exposed color-filter photoresist layer so that at least one concave portion corresponding to the position of the at least one light-shielding portion is formed on the color-filter photoresist layer; and forming the plurality of photo spacers at predetermined positions of the first substrate, wherein the predetermined positions correspond to the at least one concave portion of the color-filter photoresist layer so that the photo spacers partially extend into the at least one concave portion; wherein the photo spacers include a plurality of primary photo spacers and a plurality of secondary photo spacers; a height of the primary photo spacers is greater than that of the secondary photo spacers; the photo spacers which partially extend into the at least one concave portion are the primary photo spacers.

2. The manufacturing method as claimed in claim 1, wherein the mask has a plurality of light-shielding portions, the mask further has at least one first region and at least one second region, the number of light-shielding portions within the first region is less than the number of the light-shielding portions within the second region, wherein a distance from the first region to a center line of the curved liquid crystal display panel is less than a distance from the second region to the center line of the curved liquid crystal display panel.

3. The manufacturing method as claimed in claim 1, wherein the mask has a plurality of light-shielding portions; the light-shielding portions are arranged at intervals, wherein the intervals between the light-shielding portions and the area size of the light-shielding portions are determined according to a premeasured deformation amount of the photo spacers of the curved liquid crystal display panel.

4. The manufacturing method as claimed in claim 3, wherein a gap between two adjacent light-shielding portions ranges from 1 micrometer to 10 micrometers.

5. The manufacturing method as claimed in claim 3, wherein all of the light-shielding portions are equal in size.

6. The manufacturing method as claimed in claim 1, wherein the color-filter photoresist layer having the concave portion is mounted on the first substrate; and the step of forming the plurality of photo spacers at predetermined positions of the first substrate further includes a step of forming the photo spacers at the concave portion of the color-filter photoresist layer on the first substrate.

7. The manufacturing method as claimed in claim 1, wherein the step of forming the plurality of photo spacers at predetermined positions of the first substrate is to form the primary photo spacers at the predetermined positions of the first substrate.

8. A manufacturing method of a curved liquid crystal display panel having a first substrate, a second substrate, a liquid crystal layer mounted between the first substrate and the second substrate and a plurality of photo spacers for maintaining a gap between the first substrate and the second substrate, comprising steps of:
  coating a surface of the first substrate with photoresist materials to form a color-filter photoresist layer;
  using a mask to partially expose the color-filter photoresist layer, wherein the mask includes at least one light-transmitting portion and at least one light-shielding portion, the at least one light-shielding portion is formed at a position corresponding to an edge of the curved liquid crystal display panel;
  developing the exposed color-filter photoresist layer, so that at least one concave portion corresponding to the position of the at least one light-shielding portion is formed on the color-filter photoresist layer; and
  forming the plurality of photo spacers at predetermined positions of the second substrate, wherein the predetermined positions correspond to the at least one concave portion of the color-filter photoresist layer so that the photo spacers partially extend into the at least one concave portion; wherein the photo spacers includes a plurality of primary photo spacers and a plurality of secondary photo spacers; a height of the primary photo spacers is greater than that of the secondary photo spacers; the photo spacers which partially extend into the at least one concave portion are the primary photo spacers.

9. The manufacturing method as claimed in claim 8, wherein the mask has a plurality of light-shielding portions, the mask further has at least one first region and at least one second region, the number of light-shielding portions within the first region is less than the number of the light-shielding portions within the second region, wherein a distance from the first region to a center line of the curved liquid crystal display panel is less than a distance from the second region to the center line of the curved liquid crystal display panel.

10. The manufacturing method as claimed in claim 8, wherein the mask has a plurality of light-shielding portions, the light-shielding portions are arranged at intervals, wherein the intervals between the light-shielding portions and the area size of the light-shielding portions are determined according to a premeasured deformation amount of the photo spacers of the curved liquid crystal display panel.

11. The manufacturing method as claimed in claim 10, wherein a gap between two adjacent light-shielding portions ranges from 1 micrometer to 10 micrometers.

12. The manufacturing method as claimed in claim 10, wherein all of the light-shielding portions are equal in size.

13. The manufacturing method as claimed in claim 8, wherein
  the color-filter photoresist layer having the concave portion is mounted on the first substrate; and
  in the step of forming the plurality of photo spacers at predetermined positions on the second substrate, the photo spacers are formed at predetermined positions on the second substrate, and the predetermined positions correspond to the concave portion of the color-filter photoresist layer on the first substrate.

14. The manufacturing method as claimed in claim 8, wherein the step of forming the plurality of photo spacers at predetermined positions on the second substrate is to form the primary photo spacers at the predetermined positions on the second substrate.

15. A curved liquid crystal display panel comprising:
  a first substrate;
  a second substrate mounted opposite to the first substrate, wherein a color-filter photoresist layer having at least one concave portion is mounted on the first substrate; the concave portion corresponds to an edge of the curved liquid crystal display panel;
  a liquid crystal layer mounted between the first substrate and the second substrate;
  a plurality of photo spacers for maintaining a gap between the first substrate and the second substrate, wherein the photo spacers are formed at predetermined positions of the first substrate, and the predetermined positions correspond to the at least one concave portion of the color-filter photoresist layer;
  wherein the photo spacers includes a plurality of primary photo spacers and a plurality of secondary photo spacers; a height of the primary photo spacers is greater than that of the secondary photo spacers; the primary photo spacers partially extend into the at least one concave portion.

16. The curved liquid crystal display panel as claimed in claim 15, wherein the color-filter photoresist layer having the concave portion is mounted on the first substrate; and the photo spacers are formed at the concave portion of the color-filter photoresist layer on the first substrate.

17. The curved liquid crystal display panel as claimed in claim 15, wherein the photo spacers that are formed at the predetermined positions of the first substrate are the primary photo spacers.

\* \* \* \* \*